United States Patent [19]

Proscia

[11] Patent Number: 5,286,520
[45] Date of Patent: Feb. 15, 1994

[54] PREPARATION OF FLUORINE-DOPED TUNGSTIC OXIDE

[75] Inventor: James W. Proscia, Dearborn, Mich.

[73] Assignee: Ford Motor Company, Dearborn, Mich.

[21] Appl. No.: 806,177

[22] Filed: Dec. 13, 1991

[51] Int. Cl.$^5$ .............................................. B05D 5/12
[52] U.S. Cl. ................................. 427/109; 427/126.2; 427/126.3; 427/166; 427/226; 427/255.2; 427/255.3; 427/255
[58] Field of Search ................... 427/109, 126.2, 126.3, 427/226, 255.2, 255.3, 255, 166; 423/60

[56] References Cited

U.S. PATENT DOCUMENTS

| 3,457,106 | 7/1922 | Gillery | 427/109 |
| 4,172,159 | 10/1979 | Marcault | 427/110 |
| 4,746,549 | 5/1988 | Ito et al. | 427/255.1 |

OTHER PUBLICATIONS

Applied Physics Letters, vol. 59, No. 14, Sep. 30, 1991, N.Y. pp. 1790–1792-M. Rothschild et al.
Thin Solid Films, vol. 138, No. 2, 1986, Lausanne CH pp. 279–287 G. L. Harding (no month).

*Primary Examiner*—Janyce Bell
*Attorney, Agent, or Firm*—Lorraine S. Melotik; Roger L. May

[57] ABSTRACT

Fluorine-doped tungstic oxide is prepared by reacting together tungsten hexafluoride, an oxygen-containing compound, and a fluorine-containing compound.

13 Claims, No Drawings

PREPARATION OF FLUORINE-DOPED TUNGSTIC OXIDE

FIELD OF THE INVENTION

This invention relates generally to the preparation of fluorine-doped tungstic oxide. More particularly, the invention relates to the deposition of a blue colored, infrared reflecting, electrically conductive layer of fluorine-doped tungstic oxide onto the surface of a glass sheet by chemical vapor deposition. Tungsten hexafluoride is reacted with an oxygen-containing compound and a fluorine-containing compound adjacent the surface of a hot glass ribbon, to produce said layer of $WO_{3-x}F_x$.

BACKGROUND OF THE INVENTION

It is well-known in the glass art to coat glass sheets with metallic and/or dielectric materials, to impart enhanced solar and optical properties to the glass sheets. For example, it is known to place multiple layers of metals and dielectrics onto glass to produce electrically conductive coatings which are transparent to visible light and highly reflective to infrared radiation. It is also known to deposit conductive metal oxides onto glass, such as, for example, fluorine-doped tin oxide, which oxides are also highly reflective to infrared radiation.

The transmitted and reflected colors of glass sheet coatings may also be varied, depending upon the thicknesses and optical interference effects of such coatings, the presence of color producing adjuvants, the color of the metal or dielectric layer deposited onto the glass, etc.

Many methods for depositing metal and dielectric coatings onto glass are well-known. Examples of conventional deposition processes include liquid and powder spray pyrolysis, wherein liquids or solid particles containing film forming reactants are sprayed onto the surface of a hot glass ribbon being produced by the well-known float glass process. A convenient method for depositing coatings onto glass is by way of chemical vapor deposition, wherein vaporized film-forming precursors are reacted at or near the surface of a hot glass ribbon to form the metal or dielectric film thereon. Chemical vapor deposition does not suffer from the problems associated with either liquid or powder spray pyrolysis processes. Liquid spray pyrolysis substantially cools the hot glass ribbon, while powder spray pyrolysis requires a complex, delicate powder handling and delivery system.

W. L. Jolly, "The Principles of Inorganic Chemistry," McGraw-Hill, New York (1976) p. 226 discloses that fluorine-doped tungstic oxide may be prepared from $WO_3$ by replacing some of the oxygen atoms with fluorine atoms. Fluorine-doped tungstic oxide is blue in color, and its intensity is dependent upon the concentration of fluorine atoms in the matrix. Tungstic oxide additionally is electrically conductive and infrared energy reflective. A layer of fluorine-doped tungstic oxide on glass would be useful for producing a tinted, electrically heatable, solar load reducing glazing for automotive or architectural use.

A. W. Sleight, "Tungsten and Molybdenum Oxyfluorides of the Type $MO_{3-x}F_x$," Inorganic Chemistry, vol. 8, no. 8, (1969) pp. 1764–1767 discloses an alternative method for producing fluorine-doped tungstic oxide. Tungsten metal, tungstic oxide, and hydrofluoric acid are reacted together at about 700° C. and 3,000 atmospheres to form single crystals of $WO_{3-x}F_x$, wherein x is from about 0.17 to about 0.66.

Also, C. E. Derrington et. al., "Preparation and Photoelectrolytic Behavior of the Systems $WO_3$ and $WO_{3-x}F_x$," Inorganic Chemistry, vol. 17, no. 4 (1978) pp. 977–980 discloses a method for preparing fluorine-doped tungstic oxide, wherein tungstic oxide is reacted with potassium bifluoride at about 650° C. to produce $WO_{3-x}F_x$.

Finally, D. K. Benson et al., "Preparation of Electrochromic Metal Oxide Films by Plasma-Enhanced Chemical Vapor Deposition," 31st Annual SPIE International Technical Symposium on Optics and Electro-Optics, Conference 823, August (1987) discloses the result of reacting together tungsten hexafluoride and oxygen in a plasma reactor. Tungstic oxide is formed, but without the inclusion of fluorine atoms. The article additionally discloses that the reaction between tungsten hexafluoride, molybdenum hexafluoride, and oxygen produces an oxide having two distinct phases; the first is fluorine-free tungstic oxide, and the second is $MoO_{3-x}F_x$. These results are surprising, since one would expect that the fluorine made available by the decomposition of the tungsten hexafluoride and molybdenum hexafluoride would result in fluorine doping of the tungstic oxide matrix as well as the molybedenum oxide matrix. However, only fluorine-free tungstic oxide was produced. Furthermore, the article does not suggest that the use of a fluorine-containing compound in addition to the disclosed compounds used in both reactions would be any more effective for doping the tungstic oxide than the available fluorine atoms generated by the decomposition of the tungsten hexafluoride reactant.

It must be noted that the prior art referred to hereinabove has been collected and examined only in light of the present invention as a guide. It is not to be inferred that such diverse art would otherwise be assembled absent the motivation provided by the present invention, nor that the cited prior art when considered in combination suggests the present invention absent the teachings herein.

It would be desirable to prepare fluorine-doped tungstic oxide by a simple chemical vapor deposition process, for coating glass surfaces for the production of blue tinted, electrically conductive, infrared radiation reflective automotive and architectural glazings.

SUMMARY OF THE INVENTION

Accordant with the present invention, a novel process for preparing fluorine-doped tungstic oxide has surprisingly been discovered. The process comprises reacting together tungsten hexafluoride, an oxygen-containing compound, and a fluorine-containing compound at a temperature and for a time sufficient to form $WO_{3-x}F_x$.

The inventive process is useful for coating glass sheets, to produce blue tinted, electrically conductive, infrared reflective automotive and architectural glazings.

DETAILED DESCRIPTION OF THE PREFERRED EMBODIMENT

The invention is directed to a process for preparing fluorine-doped tungstic oxide by reacting together tungsten hexafluoride, an oxygen-containing compound, and a fluorine-containing compound at a temperature and for a time sufficient to form $WO_{3-x}F_x$. Advantageously, the inventive process may be used to coat glass sheets, to prepare blue tinted, electrically conductive, infrared reflecting automotive and architectural glazings.

The first reactant for use according to the present invention is tungsten hexafluoride. Tungsten hexafluoride ($WF_6$) is a well-known chemical reagent which may be produced by the direct fluorination of powdered tungsten metal. Additional information concerning the properties of tungsten hexafluoride are set forth in "Kirk-Othmer Concise Encyclopedia of Chemical Technology," John Wiley & Sons, New York (1985) at page 504.

The second reactant used in the process of the present invention is an oxygen-containing compound. Contemplated equivalent oxygen-containing compounds having the same operability and utility include, but are not necessarily limited to, alcohols e.g., isopropyl alcohol, t-butyl alcohol, reethanol, elthanol, n-propanol, isobutyl alcohol, cyclohexanol, allyl alcohol, benzyl alcohol, etc., oxygen, water, and the like, as well as mixtures thereof. Preferred second reactants are isopropyl alcohol and t-butyl alcohol.

The third reactant according to the present invention is a fluorine-containing compound. Contemplated equivalent fluorine-containing compounds having the same operability and utility include, but are not necessarily limited to, 1,1-difluoroethane, 1,1,1-chlorodifluoroethane, 1,1-difluoroethylene, chlorotrifluoroethylene, carbonyl fluoride, sulfur hexafluoride, nitrogen trifluoride, trifluoroacetic acid, bromotrifluoromethane, trifluoroacetic anhydride, ethyl trifluoroacetoacetate, trifluoroethanol, ethyl trifluoroacetate, pentafluoropropionic acid, heptafluorobutyryle chloride, 1,1,1-trifluoroacetylacetone, Freons, 2-chloro-1,1,2-trifluoroethylmethyl ether, chlorodifluoroacetic acid, difluoroacetic acid, ethyl chlorofluoroacetate, methyl trifluoroacetate, ethyl-4,4,4-trifluoroacetoacetate, hydrofluoric acid, and the like, as well as mixtures and derivatives thereof. A preferred fluorine-containing compound is 1,1-difluoroethane.

The tungsten hexafluoride, oxygen-containing compound, and fluorine-containing compound are reacted together at a temperature from about 350° C. to about 450° C., for a time sufficient to result in the formation of fluorine-doped tungstic oxide. Preferably, the reaction occurs at conventional float glass annealing temperatures from about 400° C. to about 425° C. The time required for the reaction to occur is not sharply critical, and is usually in the range of up to several seconds.

Conveniently, fluorine-doped tungsten oxide may be deposited by the well-known atmospheric pressure chemical vapor deposition method onto the surface of a hot glass ribbon being produced by the well-known float glass process. Thus, the coated glass may be used to manufacture blue-tinted, electrically conductive, infrared reflecting automotive and architectural glazings. The three reactants may be vaporized and conveyed to the surface of the hot glass ribbon where the inventive reaction occurs as a result of the heat retained by the glass ribbon. The vapors pyrolytically decompose and combine to form $WO_{3-x}F_x$. As will be readily apparent to one ordinarily skilled in the art, the value of x in the formula $WO_{3-x}F_x$ may vary over wide limits, depending in part upon the concentration of the fluorine-containing compound in the reaction mixture. The value of x may vary from greater than zero to about less than one.

The concentrations of reactants for use in the process of the present invention may vary over wide limits. Generally, the molar ratio of tungsten hexafluoride to oxygen-containing compound is from about 5:1 to about 1:2. Preferably, the molar ratio is from about 3:1 to about 1:1. The fluorine-containing compound is generally present in an amount from about 1% to about 50% by weight of the total reaction mixture. Preferably, the concentration is from about 5% to about 30% by weight of the reaction mixture.

The reactants may each, individually be prepared by any conventional procedure known to be useful for generating vaporized reactants such as, for example, the thermal vaporization of a liquid reactant, the vaporization of a dispersed or fluidized reactant powder in a hot inert carrier gas stream, the bubbling of an inert carrier gas through a liquid reactant, etc. Inert carrier gases include, but are not necessarily limited to, helium, nitrogen, hydrogen, argon, and the like, as well as mixtures thereof.

The glass upon which $WO_{3-x}F_x$ is deposited in a preferred embodiment of the present invention may be any of the types of glass generally known in the art of glass making. Particularly useful is soda-lime-silica glass, produced by the well-known float glass process. Other glasses include, without limitation, borosilicate glass, boroaluminosilicate glass, alkali-lime-silica glass, aluminosilicate glass, phosphate glass, fused silica, and the like.

EXAMPLES

Three glass panels are coated with fluorine-doped tungstic oxide to a thickness of about 4,000 Angstroms in an atmospheric pressure chemical vapor deposition reactor, by combining in the reaction zone streams of about 3.0 liters per minute of about 3% isoprophyl alcohol in nitrogen, about 2.2 liters per minute of about 9.9% tungsten hexafluoride in nitrogen, and varying amounts of 1,1-difluoroethane as set forth in Table 1. A nitrogen flow of about 4 lpm is used to keep the reactants separated until they are reacted together at the surface of the glass panels. The coated glass panels so produced are blue in color and have the properties set forth in Table 1.

TABLE 1

| $WO_{3-x}F_x$ Coated Glass Panels | | |
|---|---|---|
| Concentration of 1,1-Difluoroethane In Rx Mixture | Conductivity $Scm^{-1}$ | Infrared Reflectance Minimum |
| 0.41 lpm | 0.5 | 880 nm |
| 1.0 lpm | 4 | 780 nm |
| 2.0 lpm | 18 | 580 nm |

From the foregoing description, one skilled in the art can easily ascertain the essential characteristics of the present invention, and without departing from the spirit and scope thereof, can make various changes and modifications to the invention to adapt it to various usages and conditions.

I claim:

1. A process for preparing a layer of fluorine-doped tungstic oxide on a substrate by a chemical vapor deposition method, comprising reacting together at the surface of the substrate tungsten hexafluoride, an oxygen-containing compound, and a fluorine-containing compound at a temperature from about 350° C. to about 450° C. and for a time sufficient to form a layer of $WO_{3-x}F_x$ on the surface of the substrate, wherein x if from greater than zero to about less than one.

2. The process for preparing fluorine-doped tungstic oxide according to claim 1, wherein the oxygen-containing compound is selected from the group consisting of isopropyl alcohol and t-butyl alcohol.

3. The process for preparing fluorine-doped tungstic oxide according to claim 1, wherein the fluorine-containing compound is 1,1-difluoroethane.

4. The process according to claim 1, wherein said fluorine-containing compound is selected from the group consisting of 1,1-difluoroethane, 1,1,1-chlorodifluoroethane, 1,1-difluoroethylene, chlorotrifluoroethylene, carbonyl fluoride, sulfur hexafluoride, nitrogen trifluoride, trifluoroacetic acid, bromotrifluoromethane, trifluoroacetic anhydride, ethyl trifluoroacetoacetate, trifluoroethanol, ethyl trifluoroacetate, pentafluoropropionic acid, heptafluorobutyryle chloride, 1,1,1-trifluoroacetylacetone, Freon, 2-chloro-1,1,2-trifluoroethylmethyl ether, chlorodifluoroacetic acid, difluoroacetic acid, ethyl chlorofluoroacetate, methyl trifluoroacetate, ethyl-4,4,4-trifluoroacetoacetate, hydrofluoric acid, as well as mixtures and derivatives thereof.

5. The process for preparing fluorine-doped tungstic oxide according to claim 1, wherein the molar ratio of tungsten hexafluoride to oxygen-containing compound is from about 5:1 to about 1:2.

6. The process for preparing fluorine-doped tungstic oxide according to claim 1, wherein the fluorine-containing compound comprises from about 1% to about 50% by weight of the reaction mixture.

7. A process for preparing a layer of fluorine-doped tungstic oxide on a substrate by a chemical vapor deposition method, comprising reacting together at the surface of the substrate tungsten hexafluoride, an oxygen-containing compound selected from the group consisting of isopropyl alcohol and t-butyl alcohol, and 1,1-difluoroethane, the molar ratio of tungsten hexafluoride to oxygen-containing compound being from about 3:1 to about 1:2, the 1,1-difluoroethane being from about 5% to about 30% by weight of the reaction mixture, at a temperature from about 400° C. to about 425° C. and a time sufficient to form $WO_{3-x}F_x$, wherein x is from greater than zero to about less than one.

8. A process for coating glass by a chemical vapor deposition method, comprising the steps of:
 (a) providing a glass substrate, having a surface; and
 (B) reacting at the surface of the substrate tungsten hexafluoride, an oxygen-containing compound, and a fluorine-containing compound, at a temperature from about 350° C. to about 450° C. and for a time sufficient to form a layer of $WO_{3-x}F_x$ on the surface of the glass substrate, wherein x is greater than zero to about less than one.

9. The process for coating glass according to claim 8, wherein the oxygen-containing compound is selected from the group consisting of isopropyl alcohol and t-butyl alcohol.

10. The process for coating glass according to claim 8, wherein the fluorine-containing compound is 1,1-difluoroethane.

11. The process for coating glass according to claim 8, wherein the molar ratio of tungsten hexafluoride to oxygen-containing compound is from about 5:1 to about 1:2.

12. The process for coating glass according to claim 8, wherein the fluorine-containing compound comprises from about 1% to about 50% by weight of the reaction mixture.

13. A process for preparing a blue tinted, electrically conductive, infrared radiation reflecting coated glazing for automotive or architectural use by a chemical vapor deposition method, comprising the steps of:
 (A) providing a glass substrate, having a surface; and
 (B) reacting at the surface of the substrate tungsten hexafluoride, an oxygen-containing compound selected from the group consisting of isopropyl alcohol and t-butyl alcohol, and 1,1-difluoroethane, the molar ratio of tungsten hexafluoride to oxygen-containing compound being from about 3:1 to about 1:1, the 1,1-difluoroethane being from about 5% to about 30% by weight of the reaction mixture, at a temperature from about 400° C. to about 425° C. and for a time sufficient to form a layer of $WO_{3-x}F_x$ on the surface of the glass substrate, wherein x is from greater than zero to about less than one.

* * * * *